(12) United States Patent
Nishi et al.

(10) Patent No.: US 9,496,428 B2
(45) Date of Patent: Nov. 15, 2016

(54) PHOTOELECTRIC CONVERSION DEVICE AND MANUFACTURING METHOD THEREOF

(75) Inventors: Kazuo Nishi, Kanagawa (JP); Naoto Kusumoto, Kanagawa (JP)

(73) Assignee: Semiconductor Energy Laboratory Co., Ltd. (JP)

(*) Notice: Subject to any disclaimer, the term of this patent is extended or adjusted under 35 U.S.C. 154(b) by 800 days.

(21) Appl. No.: 12/820,439

(22) Filed: Jun. 22, 2010

(65) Prior Publication Data
US 2011/0000545 A1    Jan. 6, 2011

(30) Foreign Application Priority Data

Jul. 3, 2009 (JP) .................. 2009-158529

(51) Int. Cl.
H01L 31/0236 (2006.01)
H01L 31/0224 (2006.01)
H01L 31/0352 (2006.01)
H01L 31/075 (2012.01)
H01L 31/20 (2006.01)
H01L 31/046 (2014.01)

(52) U.S. Cl.
CPC . H01L 31/022433 (2013.01); H01L 31/02363 (2013.01); H01L 31/035281 (2013.01); H01L 31/046 (2014.12); H01L 31/075 (2013.01); H01L 31/202 (2013.01); Y02E 10/548 (2013.01); Y02P 70/521 (2015.11)

(58) Field of Classification Search
None
See application file for complete search history.

(56) References Cited

U.S. PATENT DOCUMENTS 4,046,594 A * 9/1977 Tarui et al. .......... 136/244
4,385,199 A    5/1983 Hamakawa et al.
4,385,200 A    5/1983 Hamakawa et al.
4,388,482 A    6/1983 Hamakawa et al.
4,591,893 A * 5/1986 Yamazaki .................. 257/458

(Continued)

FOREIGN PATENT DOCUMENTS

EP    0 053 402 A2    6/1982
EP    2 028 696 A2    2/2009

(Continued)

OTHER PUBLICATIONS

Oxford English Dictionary "electrode, n." OED Online. Oxford University Press, Jun. 2014. Web. Aug. 9, 2014.*

(Continued)

*Primary Examiner* — Magali P Slawski
(74) *Attorney, Agent, or Firm* — Husch Blackwell LLP

(57) ABSTRACT

A stack including a first electrode, a first impurity semiconductor layer having one conductivity type, an intrinsic semiconductor layer, a second impurity semiconductor layer having an opposite conductivity type to the one conductivity type, and a light-transmitting second electrode is formed over an insulator. The light-transmitting second electrode and the second impurity semiconductor layer have one or more openings. The shortest distance between one portion of the wall of one opening and an opposite portion of the wall of the same opening at the level of the interface between the second impurity semiconductor layer and the intrinsic semiconductor layer is made smaller than the diffusion length of holes in the intrinsic semiconductor layer. Thus, recombination is suppressed, so that more photocarriers are generated due to the openings and taken out as current, whereby conversion efficiency is increased.

21 Claims, 9 Drawing Sheets

(56) References Cited

U.S. PATENT DOCUMENTS

| | | | |
|---|---|---|---|
| 4,782,376 A | 11/1988 | Catalano | |
| 6,365,823 B1* | 4/2002 | Kondo | 136/246 |
| 7,052,998 B2 | 5/2006 | Shinohara | |
| 7,498,508 B2 | 3/2009 | Rubin et al. | |
| 2003/0178057 A1* | 9/2003 | Fujii et al. | 136/256 |
| 2005/0070107 A1 | 3/2005 | Shinohara | |
| 2007/0199588 A1* | 8/2007 | Rubin et al. | 136/243 |
| 2009/0020149 A1* | 1/2009 | Woods et al. | 136/244 |
| 2009/0050190 A1 | 2/2009 | Nishida et al. | |
| 2011/0036402 A1* | 2/2011 | Ishihara et al. | 136/256 |

FOREIGN PATENT DOCUMENTS

| | | |
|---|---|---|
| JP | 55-120181 | 9/1980 |
| JP | 57-181176 | 11/1982 |
| JP | 60077471 A * | 5/1985 |
| JP | 62-276884 A | 12/1987 |
| JP | 06-097473 A | 4/1994 |
| JP | 7-130661 | 5/1995 |
| JP | 07-254720 A | 10/1995 |
| JP | 10-209048 | 8/1998 |
| JP | 2004-79934 | 3/2004 |
| JP | 2005-101384 | 4/2005 |
| TW | 200910614 | 3/2009 |
| WO | WO 2007/095757 A1 | 8/2007 |

OTHER PUBLICATIONS

English language abstract of Goto, JP 60077471 A.*
International Search Report re application No. PCT/JP2010/060414, dated Jul. 20, 2010.
Written Opinion re application no. PCT/JP2010/060414, dated Jul. 20, 2010.
Taiwanese Office Action re Application No. TW 099121692, dated Dec. 9, 2014.

* cited by examiner

PHOTOELECTRIC CONVERSION DEVICE AND MANUFACTURING METHOD THEREOF

TECHNICAL FIELD

The present invention relates to a photoelectric conversion device and a manufacturing method thereof.

BACKGROUND ART

Global warming has become a serious problem, and energy sources which will replace fossil fuels have been attracting increasing attention. In recent years, research and development on photoelectric conversion devices, which are also called solar cells, have become very active, and the market is rapidly expanding.

The photoelectric conversion devices are attractive power generation means which use inexhaustible sunlight as the energy source and which do not emit carbon dioxide at the time of power generation. However, there are problems under present conditions in that photoelectric conversion efficiency per unit area is not sufficient, that the amount of power generation is affected by the daylight hours, and the like. Accordingly, a long time of around 20 years is needed for recovery of the initial cost. These problems prevent the widespread use of the photoelectric conversion devices for residential use. Thus, an increase in efficiency and a reduction in cost of the photoelectric conversion devices are required.

The photoelectric conversion devices can be manufactured using a silicon-based material or a compound semiconductor material. Most of the photoelectric conversion devices sold in the market use a silicon-based material such as bulk silicon or thin film silicon. The bulk silicon photoelectric conversion device which is formed using a single crystal silicon wafer or a polycrystalline silicon wafer has relatively high conversion efficiency. However, a region which is actually utilized for photoelectric conversion is only a part of the silicon wafer in the thickness direction, and the other region only serves as a support which has conductivity. Further, loss of a material used as a cutting margin which is required in cutting out the silicon wafer from an ingot, necessity of a polishing step, and the like are also the factors that prevent a decrease in cost of the bulk silicon photoelectric conversion devices.

On the other hand, a thin film silicon photoelectric conversion device can be formed by forming a silicon thin film using a required amount of silicon by a plasma CVD method or the like. In addition, by a laser method, a screen printing method, or the like, higher integration of a thin film silicon photoelectric conversion device is easy, and the thin film silicon photoelectric conversion device can be manufactured at lower cost than the bulk silicon photoelectric conversion device. However, the thin film silicon photoelectric conversion device has a disadvantage in that it has a lower conversion efficiency than the bulk silicon photoelectric conversion device.

In order to improve the conversion efficiency of the thin film silicon photoelectric conversion device, a method in which silicon oxide is used instead of silicon for a p-type semiconductor layer serving as a window layer has been suggested (e.g., Patent Document 1). A thin film of a non-single-crystal silicon based p-type semiconductor has a high light absorption coefficient, so that it hinders light absorption by an i-type semiconductor layer. In Patent Document 1, silicon oxide, which has a larger band gap than silicon, is used for a p-type semiconductor layer so as to suppress light absorption by the window layer.

In addition, a structure in which an inversion layer which is formed by a field effect is used instead of a p-type semiconductor layer or an n-type semiconductor layer which serves as a window layer has been suggested. In such a structure, by forming a light-transmitting dielectric or conductor over an n-i or p-i structure, an n-i-p or p-i-n junction can be formed when an electric field is applied. This structure is for the purpose of reducing loss of light due to light absorption by the window layer as much as possible in order to increase a light-absorption efficiency of the i-type semiconductor layer.

[Patent Document 1] Japanese Published Patent Application No. H07-130661

DISCLOSURE OF INVENTION

In a photoelectric conversion device in which silicon oxide is used instead of silicon for a p-type semiconductor layer serving as a window layer, loss of light due to light absorption by the window layer is reduced, leading to an increase in rate of light which reaches a light absorption layer. On the other hand, there is a problem in that resistance of silicon oxide, which has a larger band gap than silicon, cannot be reduced sufficiently; accordingly, current loss due to the resistance is large.

In addition, a field effect photoelectric conversion device has many technical difficulties; for example, although a rate of light which reaches the i-type semiconductor layer is increased, relatively high voltage is needed for formation of the inversion layer. Accordingly, commercialization has not been achieved.

In view of the foregoing problems, one of the objects according to one embodiment of the present invention disclosed in this specification is to provide a photoelectric conversion device in which loss of light due to light absorption by the window layer is reduced. In addition, it is another object to provide a manufacturing method for the photoelectric conversion device.

One embodiment of the present invention disclosed in this specification is a thin film photoelectric conversion device having an nip or pin junction over an insulator. The photoelectric conversion device includes a portion in which light enters an intrinsic semiconductor layer serving as a light absorption layer without passing through an impurity semiconductor layer serving as a window layer.

One embodiment of the present invention disclosed in this specification is a photoelectric conversion device comprising a conductive film to serve as a first electrode over an insulator, a first impurity semiconductor layer having one conductivity type over the first electrode, an intrinsic semiconductor layer over the first impurity semiconductor layer, a second impurity semiconductor layer having an opposite conductivity type to the one conductivity type over the intrinsic semiconductor layer, and a light-transmitting conductive film to serve as a second electrode over the second impurity semiconductor layer. Openings are formed in the second electrode and the second impurity semiconductor layer. At least one of the openings is formed in a light-receiving portion.

Ordinal numbers such as first and second which are used in description of the present invention are given for convenience in order to distinguish elements, and they are not intended to limit the number of elements, the arrangement, nor the order of the steps.

In this specification, an "intrinsic semiconductor" refers to not only a so-called intrinsic semiconductor in which the Fermi level lies in the middle of the band gap, but a semiconductor in which the concentration of an impurity imparting p-type or n-type conductivity is $1\times10^{20}$ cm$^{-3}$ or lower, the concentration of oxygen and nitrogen is $9\times10^{19}$ cm$^{-3}$ or lower, and photoconductivity is 100 times or more than the dark conductivity. This intrinsic semiconductor includes a semiconductor which includes an impurity element belonging to Group 13 or Group 15 of the periodic table. In this specification, an "i-type semiconductor" is a synonym for an "intrinsic semiconductor."

In addition, a "light-receiving portion" in this specification refers to a region which contributes to photoelectric conversion in a light-receiving region of the photoelectric conversion device. For example, neither an electrode which does not transmit light nor a region which is shielded from light by materials for integration is included in the light-receiving portion.

It is preferable that the conductivity type of the first impurity semiconductor layer be n-type and the conductivity type of the second impurity semiconductor layer be p-type.

In addition, it is preferable that the thickness of the intrinsic semiconductor layer under the opening be smaller than that of the intrinsic semiconductor layer under the second electrode and the second impurity semiconductor layer. By making the intrinsic semiconductor layer under the opening thinner than the other part, a depression is formed in the cross section of the intrinsic semiconductor layer under the opening, whereby a side wall is formed. Light enters the intrinsic semiconductor layer through the side wall; accordingly, more photocarriers can be generated.

The shortest distance between one portion of the wall of one opening and an opposite portion of the wall of the same opening at the level of the interface between the second impurity semiconductor layer and the intrinsic semiconductor layer is preferably 0.5 µm to 3.0 µm inclusive in the case of using amorphous silicon and 0.5 µm to 100 µm inclusive in the case of using microcrystalline silicon or polysilicon. This distance is determined depending on a diffusion length of holes in the intrinsic semiconductor layer. The diffusion length of holes differs depending on a state of the intrinsic semiconductor. The diffusion length of holes can be measured by a surface photovoltage method or the like.

The shape of the opening can be, for example, a polygon, a circle, or an ellipse. Alternatively, a curved shape, a bent shape, or a shape with uneven widths may be employed.

The opening of the second electrode and the second impurity semiconductor layer is preferably tapered. By forming a tapered shape, light approaching obliquely can also be efficiently taken into the intrinsic semiconductor layer through the opening.

One embodiment of the present invention disclosed in this specification is a method for manufacturing a photoelectric conversion device, including the steps of forming a stack over an insulator by stacking a conductive film to serve as a first electrode, a first impurity semiconductor layer having one conductivity type, an intrinsic semiconductor layer, a second impurity semiconductor layer having an opposite conductivity type to the one conductivity type, and a light-transmitting conductive film to serve as a second electrode in this order; forming a photoresist having one or more openings over the second electrode in a region to be a light-receiving portion; etching the second electrode and the second impurity semiconductor layer to form openings; and etching a part of the intrinsic semiconductor layer.

Note that according to one embodiment of the present invention, the photoelectric conversion device has a portion where light can enter the intrinsic semiconductor layer without passing through the second electrode and the second impurity semiconductor layer. Accordingly, in that portion, the second electrode and the second impurity semiconductor layer may be removed. Note that it is preferable that a part of the intrinsic semiconductor layer be also etched. This is because by etching a part of the intrinsic semiconductor layer, a light-receiving area can be increased.

According to one embodiment of the present invention, a thin film photoelectric conversion device and a manufacturing method thereof in which light absorption by the window layer is reduced, so that the light-absorption efficiency of the intrinsic semiconductor layer serving as a light absorption layer is increased are provided.

BEST MODE FOR CARRYING OUT THE INVENTION

Figure 1:
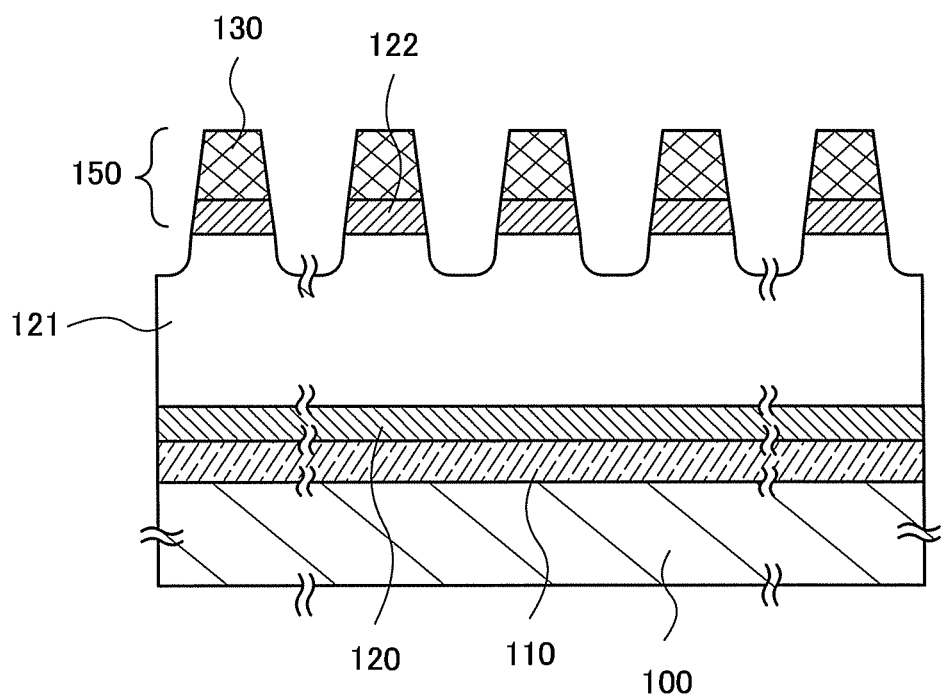
FIG. 1 is a cross-sectional schematic view illustrating a photoelectric conversion device according to one embodiment of the present invention.

Hereinafter, embodiments of the present invention are described below with reference to the drawings. Note that the present invention is not limited to the following description and it will be readily appreciated by those skilled in the art that modes and details can be modified in various ways without departing from the spirit and the scope of the present invention. Accordingly, the present invention should not be construed as being limited to the description of the embodiments to be given below. Note that in a structure of the present invention to be described below, the same reference numerals are used to denote the same components in different drawings.

(Embodiment 1)

One embodiment of the present invention is an nip or pin type non-single-crystal thin film photoelectric conversion device in which a light-transmitting conductive film and an impurity semiconductor layer which have an opening are formed over an intrinsic semiconductor layer. In addition, the thickness of the intrinsic semiconductor layer under the opening is smaller than that of the intrinsic semiconductor layer under the light-transmitting conductive film and the impurity semiconductor layer.

Figure 2A:
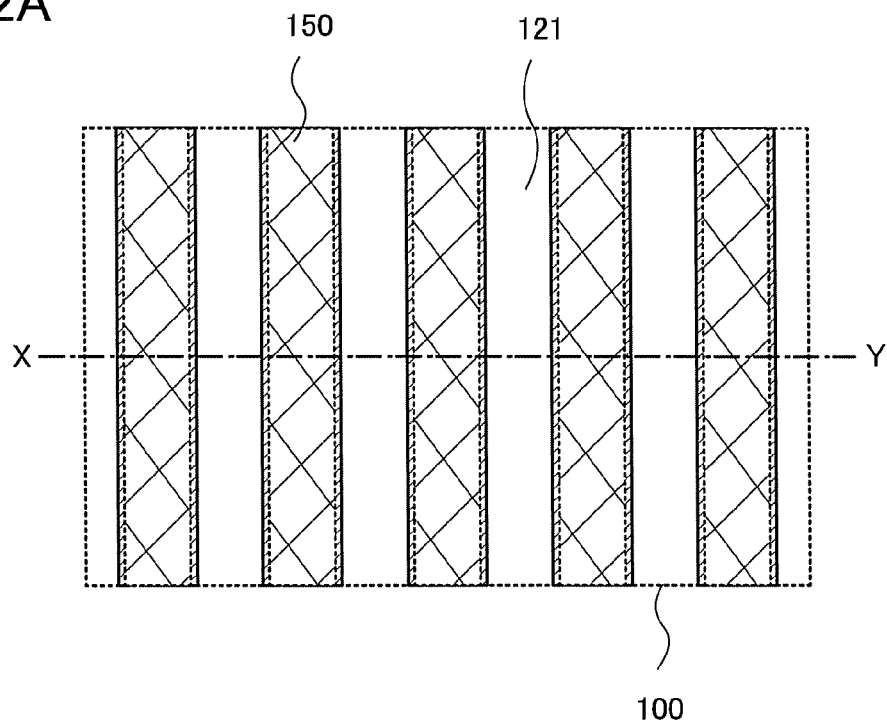
FIGS. 2A and 2B are plan schematic views each illustrating a photoelectric conversion device according to one embodiment of the present invention.

The structure of the photoelectric conversion device according to one embodiment of the present invention will be described. The photoelectric conversion device according to one embodiment of the present invention has, as is shown in the cross-sectional view of FIG. 1, a first electrode 110, a first impurity semiconductor layer 120, an intrinsic semiconductor layer 121, a second impurity semiconductor layer 122, and a second electrode 130 over an insulator 100. Hereinafter, a single photoelectric conversion device having a structure like the one in FIG. 1, which is not integrated, is referred to as a photoelectric conversion cell. FIG. 1 is a cross-sectional view taken along line X-Y in a plan view of FIG. 2A. Note that FIG. 2A is an enlarged partial plan view of an example of a photoelectric conversion cell according to this embodiment.

For the insulator 100, a glass substrate is used for example, but there is no particular limitation and any insulator that can withstand a manufacturing process of the photoelectric conversion device according to the present invention can be used. Specifically, various glass substrates used in the electronics industry, such as substrates formed of aluminosilicate glass, aluminoborosilicate glass, and bariumborosilicate glass can be given, as well as a quartz substrate, a ceramic substrate, a sapphire substrate, and the like. Alternatively, a resin substrate formed of, for example, PET (polyethylene terephthalate) or PEN (polyethylene naphthalate) can be used. Further alternatively, a metal substrate formed of aluminum, stainless steel, or the like which is provided with an insulating layer thereon can be used.

Note that although a structure in which the first electrode 110 is formed directly over the insulator 100 is employed in the description in this embodiment, a structure in which the first electrode 110 is formed over the insulator 100 with an insulating layer interposed therebetween may be employed.

The first electrode 110 is a reflective electrode which is formed using a conductive film formed of aluminum, silver, titanium, tantalum, copper, or the like. Note that a surface of the first electrode 110 may be rough. The roughness of a light-incident surface causes a light-trapping effect in the photoelectric conversion device, whereby the intrinsic semiconductor layer 121 can effectively absorb light.

Further, in order to enhance a light-trapping effect, a light-transmitting conductive material such as conductive oxynitride containing zinc and aluminum, indium oxide, an indium tin oxide alloy (ITO), or zinc oxide may be provided between the first electrode 110 and the first impurity semiconductor layer 120.

As a non-single-crystal semiconductor layer which can be applied to the intrinsic semiconductor layer 121, an amorphous semiconductor, a microcrystal semiconductor, and a polycrystalline semiconductor are given. As typical examples of an amorphous semiconductor, amorphous silicon, amorphous silicon germanium, and the like are given. As a typical example of microcrystal semiconductors, microcrystal silicon, microcrystal silicon germanium, and the like are given. As typical examples of a polycrystalline semiconductor, polysilicon, polysilicon germanium, and the like are given.

One of the first impurity semiconductor layer 120 and the second impurity semiconductor layer 122 is a p-type semiconductor layer which is doped with an impurity imparting p-type conductivity and the other is an n-type semiconductor layer which is doped with an impurity imparting n-type conductivity. In this embodiment, a structure in which a light-transmitting conductive film serving as the second electrode 130 receives light is described; consequently, the first impurity semiconductor layer 120 is an n-type semiconductor layer and the second impurity semiconductor layer 122 is a p-type semiconductor layer.

Note that an amorphous semiconductor (typically, amorphous silicon), a microcrystal semiconductor (typically, microcrystal silicon), or a polycrystalline semiconductor (typically, polysilicon) can be used for the first impurity semiconductor layer 120 and the second impurity semiconductor layer 122.

Further, for the second impurity semiconductor layer 122 serving as a window layer, a material which has a larger band gap than silicon and which has high transmittance with respect to light in a light absorption wavelength range of the intrinsic semiconductor layer 121 may be used. An example of such a material is a compound material of silicon which contains carbon or nitrogen (e.g., a-$Si_xC_{1-x}$: H (0<x<1) or a-$Si_xN_{1-x}$: H (0<x<1)) and is doped with an impurity so as to have a conductivity.

For the second electrode 130 over the second impurity semiconductor layer 122, a light-transmitting conductive film formed of indium oxide, an indium tin oxide alloy (ITO), zinc oxide, a compound of zinc oxide, tin oxide, or the like may be used.

The thickness of each film may be determined by a practitioner as appropriate in accordance with a light absorption coefficient or electrical conductivity of the film.

Figure 2B:
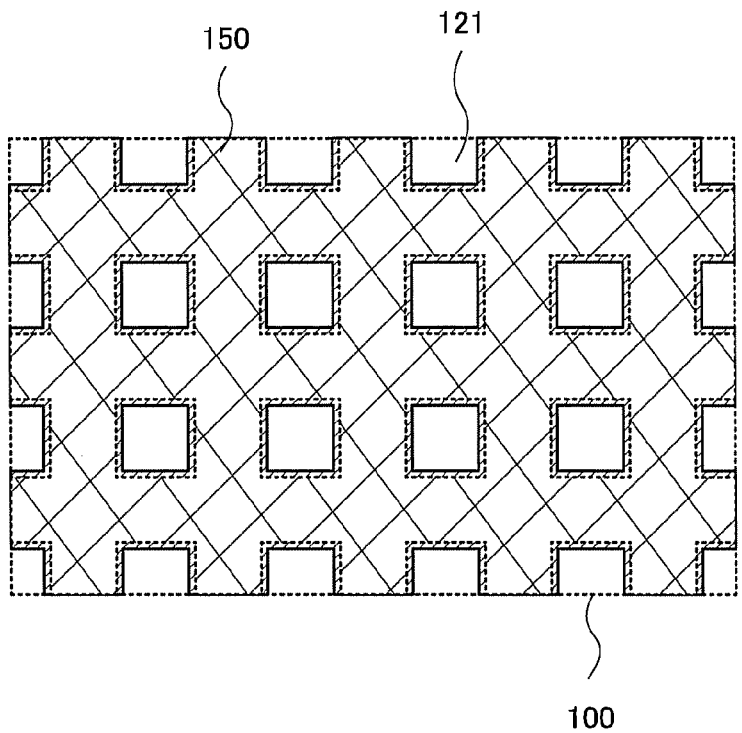

A stack 150 including the second electrode 130 and the second impurity semiconductor layer 122 is formed to have one or more openings over the intrinsic semiconductor layer 121. An example is illustrated in FIGS. 2A and 2B. Further, a collection electrode which is not shown may be additionally provided over the second electrode 130.

FIG. 2A illustrates an example of a plan view of a photoelectric conversion cell provided with the stack 150 having a plurality of openings whose shape seen from above is a rectangle; FIG. 2B illustrates an example where the stack 150 has a plurality of openings whose shape seen from above is a square. The shape of the opening is not limited to the illustrated shapes; for example, the shape may be a polygon, a circle, an ellipse, a curved shape, a bent shape, or a shape with uneven widths.

In addition, it is preferable that the thickness of the intrinsic semiconductor layer 121 under the openings be smaller than that of the intrinsic semiconductor layer under the stack 150. By making the intrinsic semiconductor layer 121 under the openings thinner than the other part, a depression is formed in the cross section of the intrinsic semiconductor layer 121 under the openings, whereby a side wall is formed. Light enters the intrinsic semiconductor layer 121 through the side wall; accordingly, more photocarriers can be generated.

In the case where photoelectric conversion cells to be integrated are formed, the stack 150 is preferably formed so that each region which forms the photoelectric conversion cell may have an opening. In such a manner, flexibility in designing an element isolation, a collection electrode, or an extraction electrode is increased. Details will be described in Embodiment 2.

There is a preferable distance between one portion of the wall of one opening of the stack 150 and an opposite portion of the wall of the same opening at the level of the interface between the second impurity semiconductor layer 122 and the intrinsic semiconductor layer 121.

The distance differs depending on the state of the material of the intrinsic semiconductor layer 121. When amorphous silicon is used for the intrinsic semiconductor layer 121, the shortest distance is preferably 0.5 µm to 3.0 µm inclusive. When microcrystalline silicon or polysilicon is used for the intrinsic semiconductor layer 121, the shortest distance is preferably 0.5 µm to 100 µm inclusive.

This distance is determined in consideration of a diffusion length of holes which is shorter than that of electron in the intrinsic semiconductor layer 121. However, since the diffusion length of holes differs depending on a state of the intrinsic semiconductor, a practitioner may determine a preferable distance. Note that a diffusion length of holes can be measured by a surface photovoltage method or the like.

Figure 5A:
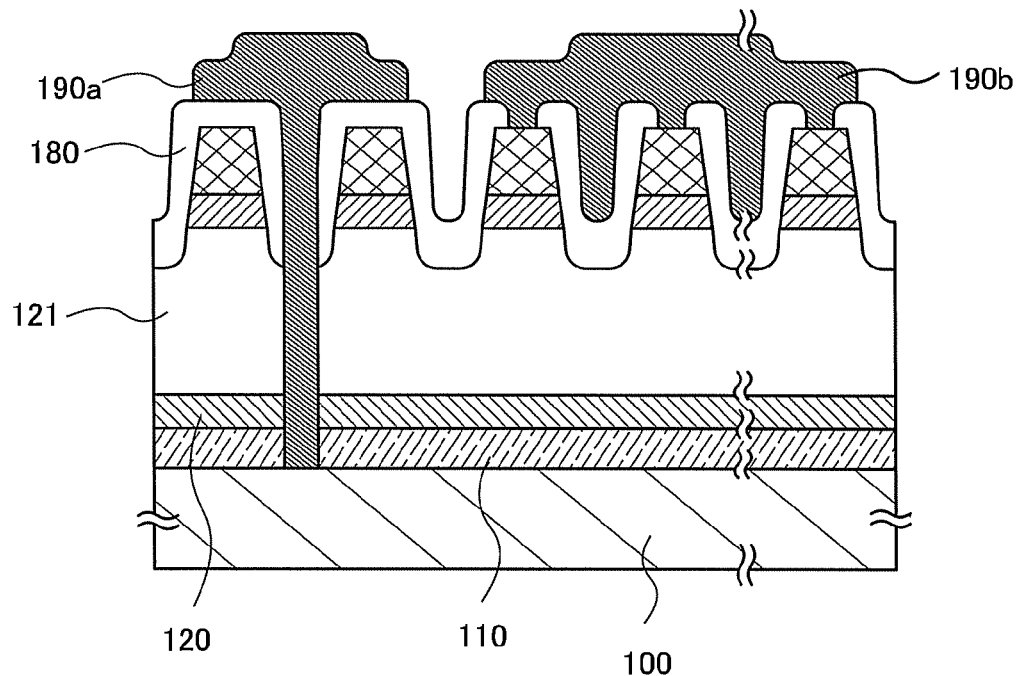
FIGS. 5A and 5B are a cross-sectional view and a plan view illustrating a method for manufacturing a photoelectric conversion device according to one embodiment of the present invention.
Figure 5B:
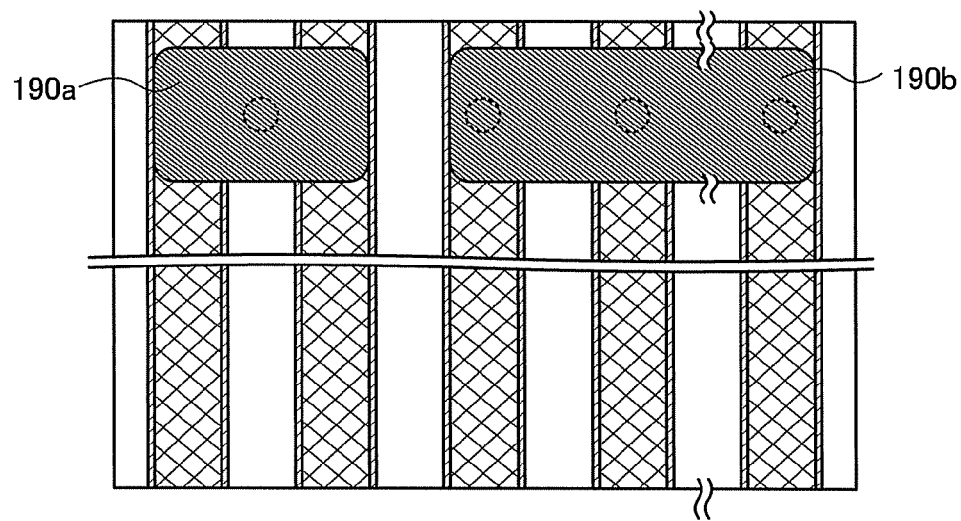

Then, a protective layer 180 formed of a light-transmitting insulating film, a contact hole, and extraction electrodes 190a and 190b formed of a conductive material are provided on a light-receiving plane side (see FIGS. 5A and 5B).

Next, an operation of the photoelectric conversion device according to one embodiment of the present invention will be described. In a light-receiving portion of the photoelectric conversion device according to one embodiment of the present invention, one or more openings are formed in the stack 150. Thus, the light-receiving portion includes two portions: a portion in which light reaches the intrinsic semiconductor layer 121 through the stack 150 and a portion in which light reaches the intrinsic semiconductor layer 121 without passing through the stack 150.

A region provided with the second impurity semiconductor layer 122, which is a p-type semiconductor layer, that is, a region which is not provided with the opening of the stack 150 has a pin junction. In that region, holes generated in the intrinsic semiconductor layer 121 by light irradiation can be moved to the second impurity semiconductor layer 122 by an internal electric field.

In a region which is not provided with the second impurity semiconductor layer 122, that is, a region provided with the opening of the stack 150, holes generated in the intrinsic semiconductor layer 121 can also be moved towards the second impurity semiconductor layer 122 in the region which is affected by an internal electric field formed by the surrounding pin junction.

Further, in a region of the intrinsic semiconductor layer 121 which is under the central portion of the opening of the stack 150 and which is not directly affected by an internal electric field formed by the surrounding pin junction, most of the holes generated in the intrinsic semiconductor layer 121 can be diffused into the region which is affected by the internal electric field without recombination. This is because the second impurity semiconductor layer 122 is formed so as to include an opening whose width does not exceed the diffusion length of holes in the intrinsic semiconductor layer 121. Although holes are described here, it is apparent that electrons, which have a longer diffusion length than holes, can also be diffused into the region affected by an internal electric field without recombination.

An effect of the photoelectric conversion device according to one embodiment of the present invention will be described. As is described above, even in a portion of the intrinsic semiconductor layer 121 receiving light which does not pass through the stack 150, most of the photocarriers generated in the intrinsic semiconductor layer 121 can be taken out without recombination during diffusion.

In other words, in the region which is not provided with the stack 150 but the openings of the stack 150, light can enter the intrinsic semiconductor layer 121 without loss due to light absorption by the stack 150. Therefore, more photocarriers can be generated and taken out as current, whereby conversion efficiency per unit area can be increased.

Note that a single junction cell has been described as an example in this embodiment, but this embodiment of the present invention can also be applied to a multi junction cell. In particular, if this embodiment is applied to the top cell, the amount of light which reaches the bottom cell can be increased, which will lead to an improvement in conversion efficiency.

Note that this embodiment can be combined as appropriate with any of the other embodiments.

(Embodiment 2)

In this embodiment, an example of a method for manufacturing the photoelectric conversion device according to one embodiment of the present invention will be described in detail with reference to drawings. Note that a description of the same parts as those of the above embodiment is omitted or partly simplified.

Figure 3A:
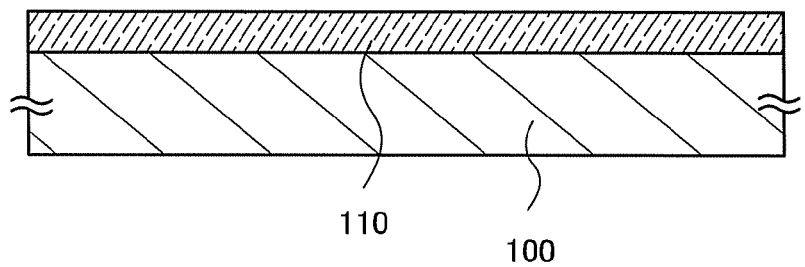
FIGS. 3A to 3C are cross-sectional views illustrating a method for manufacturing a photoelectric conversion device according to one embodiment of the present invention.

First, the first electrode 110 is formed over the insulator 100 (see FIG. 3A).

For the insulator 100, any insulator that can withstand a manufacturing process of the photoelectric conversion device according to the present invention can be used without particular limitation. A substrate having an insulating surface or an insulating substrate can be used. A glass substrate is preferably used because a large substrate can be obtained and cost can be reduced. For example, large substrates distributed as glass substrates for liquid crystal displays which have a size of 300 mm×400 mm of the first generation, 550 mm×650 mm of the third generation, 730 mm×920 mm of the fourth generation, 1000 mm×1200 mm of the fifth generation, 2450 mm×1850 mm of the sixth generation, 1870 mm×2200 mm of the seventh generation, and 2000 mm×2400 mm of the eighth generation can be used for the insulator 100.

The first electrode 110 can be formed of a conductive film which is formed of aluminum, silver, titanium, tantalum, or copper by a sputtering method or the like. Note that the first electrode 110 may have a rough surface or a light-transmitting conductive film may be provided between the first electrode 110 and the first impurity semiconductor layer 120 in order to cause a light-trapping effect.

Figure 3B:
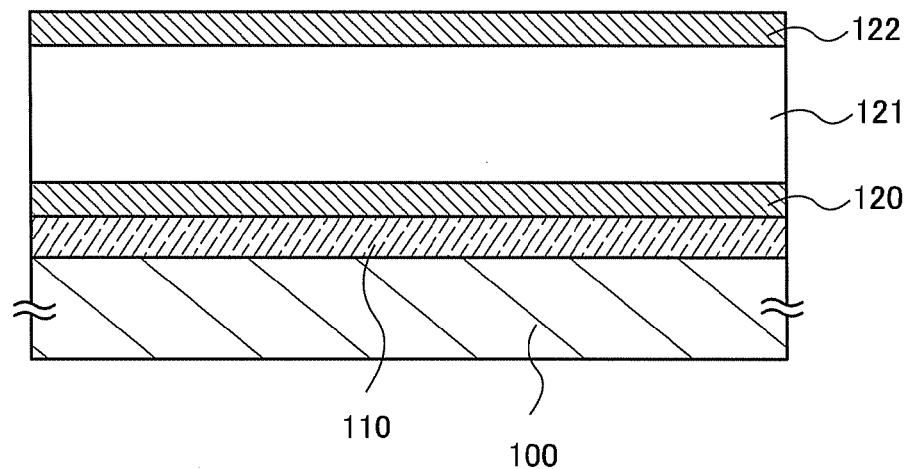

Then, the first impurity semiconductor layer 120, the intrinsic semiconductor layer 121, and the second impurity semiconductor layer 122 are formed over the first electrode 110. Although a manufacturing method for a structure in which amorphous silicon layers are used for the first impurity semiconductor layer 120, the intrinsic semiconductor layer 121, and the second impurity semiconductor layer 122 is shown as an example, the manufacturing method is not limited thereto. A different crystal state or a different material can be employed (see FIG. 3B).

The first impurity semiconductor layer 120, the intrinsic semiconductor layer 121, and the second impurity semiconductor layer 122 can be formed using a semiconductor source gas and a dilution gas as reaction gases by a chemical vapor deposition (CVD) method, typically by a plasma CVD method. As the semiconductor source gas, silicon hydride such as $SiH_4$ or $Si_2H_6$, silicon chloride such as $SiH_2Cl_2$, $SiHCl_3$, or $SiCl_4$, or silicon fluoride such as $SiF_4$ can be used. As the dilution gas, hydrogen or a rare gas such as helium, argon, krypton, and neon can be used alone or in combination (e.g., hydrogen and argon).

The first impurity semiconductor layer 120, the intrinsic semiconductor layer 121, and the second impurity semiconductor layer 122 can be formed using the reaction gasses with a plasma CVD apparatus by application of a high-frequency electric power with a frequency of 3 MHz to 300 MHz inclusive. Instead of the high-frequency electric power, a microwave electric power with an electric power frequency of 1 GHz to 5 GHz inclusive, typically 2.45 GHz may be applied.

For example, for formation of the first impurity semiconductor layer 120, the intrinsic semiconductor layer 121, and the second impurity semiconductor layer 122, silicon hydride (typically, silane) and hydrogen are mixed and glow discharge plasma is generated in a plasma CVD apparatus. Glow discharge plasma is generated by application of high-frequency power with a power frequency of 3 MHz to 30 MHz inclusive, typically 13.56 MHz or 27.12 MHz, or high-frequency power with a power frequency in the VHF band of 30 MHz to approximately 300 MHz, typically 60 MHz. The substrate is heated at 100° C. to 300° C. inclusive, preferably at 120° C. to 220° C. inclusive.

The amorphous silicon layer for the intrinsic semiconductor layer 121 is formed by a plasma CVD method. Specifically, the amorphous silicon layer can be formed in the following manner: a reaction gas is introduced into a process chamber; and a predetermined pressure is maintained to generate glow discharge plasma.

Note that it is preferable that oxygen and carbon concentrations in the intrinsic semiconductor layer 121 be as low as possible. Specifically, the oxygen concentration and the carbon concentration in the process chamber and in the reaction gas (purity of the reaction gas) are controlled so that the oxygen concentration and the carbon concentration in the intrinsic semiconductor layer 121 may be less than $5\times10^{18}/cm^3$, preferably less than $1\times10^{18}/cm^3$.

Further, in order to make the oxygen and the carbon concentrations in the intrinsic semiconductor layer 121 as low as possible, the intrinsic semiconductor layer 121 is preferably formed in an ultra high vacuum (UHV) process chamber. Specifically, it is preferable that the intrinsic semiconductor layer 121 be formed in a process chamber in which the degree of vacuum can reach $1\times10^{-8}$ Pa to $1\times10^{-5}$ Pa inclusive.

An impurity semiconductor layer having one conductivity type is used as the first impurity semiconductor layer 120. The impurity semiconductor layer having one conductivity type can be formed using a mixture of a doping gas including an impurity imparting one conductivity type and a reaction gas including a semiconductor source gas and a dilution gas. In this embodiment, a doping gas including an impurity imparting n-type conductivity is used, so that an n-type amorphous silicon layer is formed. As an impurity imparting n-type conductivity, phosphorus, arsenic, antimony, and the like, which belong to Group 15 in the periodic table, are typically given. For example, a doping gas such as phosphine is mixed into a reaction gas, so that an n-type amorphous silicon layer can be formed.

As the second impurity semiconductor layer 122, an impurity semiconductor layer having an opposite conductivity type to the first impurity semiconductor layer 120 is formed. In this embodiment, a doping gas including an impurity imparting p-type conductivity is mixed into a reaction gas, so that a p-type amorphous silicon layer is formed. As an impurity imparting p-type conductivity, boron, aluminum, and the like, which belong to Group 13 in the periodic table, are typically given. For example, a doping gas such as diborane is mixed into a reaction gas, so that a p-type amorphous silicon layer can be formed.

Figure 3C:
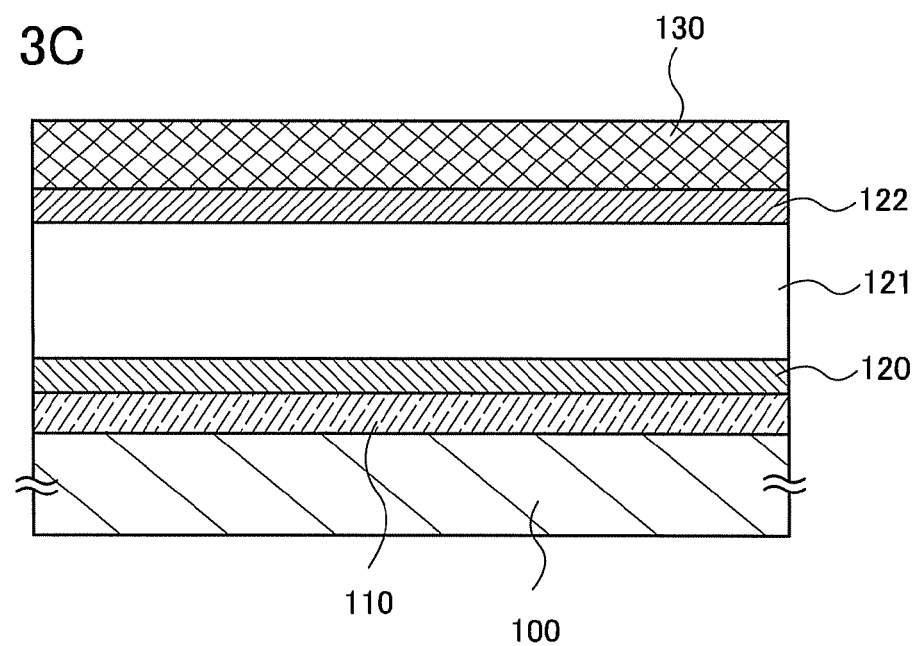

A light-transmitting conductive film which is to be the second electrode 130 is formed by a sputtering method or the like. For the second electrode 130, a light-transmitting conductive film formed of indium oxide, an indium tin oxide alloy (ITO), zinc oxide, a compound of zinc oxide, tin oxide, or the like can be used. The thickness of the second electrode 130 is preferably 50 nm to 500 nm inclusive (see FIG. 3C).

Figure 4A:
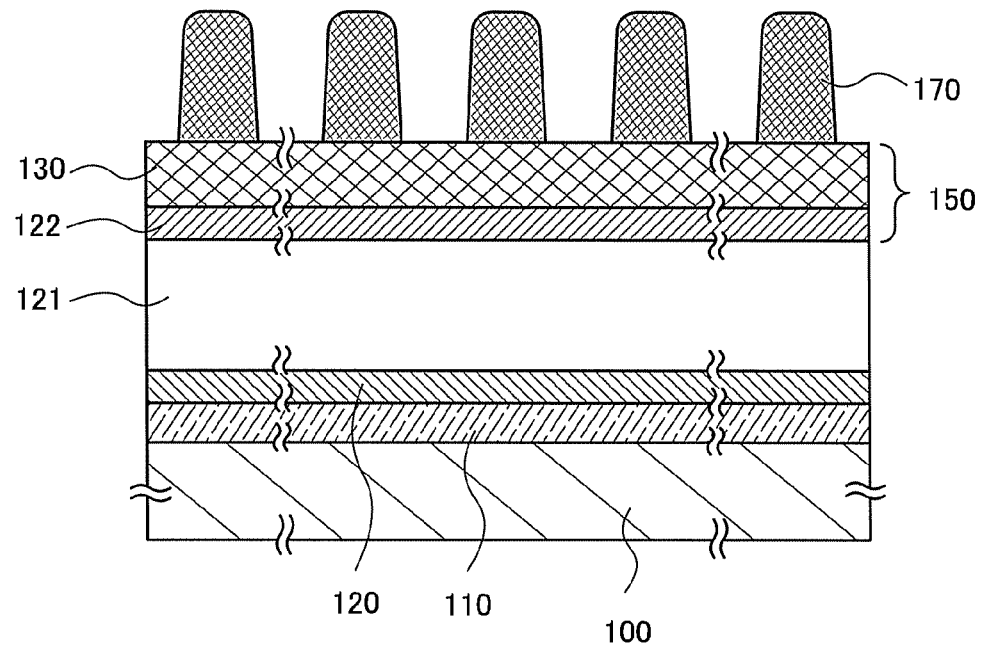
FIGS. 4A and 4B are cross-sectional views illustrating a method for manufacturing a photoelectric conversion device according to one embodiment of the present invention.

Then, a photoresist 170 having openings is formed over the second electrode 130 (see FIG. 4A). The shape of the opening is not limited to the examples in FIGS. 2A and 2B. For example, the shape may be a polygon, a circle, an ellipse, a curved shape, a bent shape, or a shape with uneven widths. Here, a photoresist having a plurality of rectangular openings as those illustrated in FIG. 2A is formed.

In order to efficiently take out photocarriers, the openings in the stack 150 including the second electrode 130 and the second impurity semiconductor layer 122 should have a preferred size described in Embodiment 1. If the opening had a larger size, a region from which carries could not be taken out is formed, which results in a decrease in photoelectric conversion efficiency per unit area.

Then, the stack 150 is etched using the photoresist having the openings as a mask. It is preferable that a part of the intrinsic semiconductor layer 121 be also etched in order to increase a light-receiving area (see FIG. 1). Although wet etching may be employed for the etching for the stack 150, dry etching is employed in this embodiment.

For example, the dry etching is performed by a reactive ion etching (RIE) method, an inductively coupled plasma (ICP) etching method, an electron cyclotron resonance (ECR) etching method, a parallel plate (capacitive coupled plasma) etching method, a magnetron plasma etching method, a dual-frequency plasma etching method, or a helicon wave plasma etching method.

As an etching gas, for example, a chlorine-based gas such as chlorine, boron chloride, or silicon chloride (including silicon tetrachloride), a fluorine-based gas such as trifluoromethane, carbon fluoride, nitrogen fluoride, or sulfur fluoride, a bromide-based gas such as hydrogen bromide, or the like can be given. Further, helium, argon, xenon, hydrogen or the like may be added.

Figure 4B:
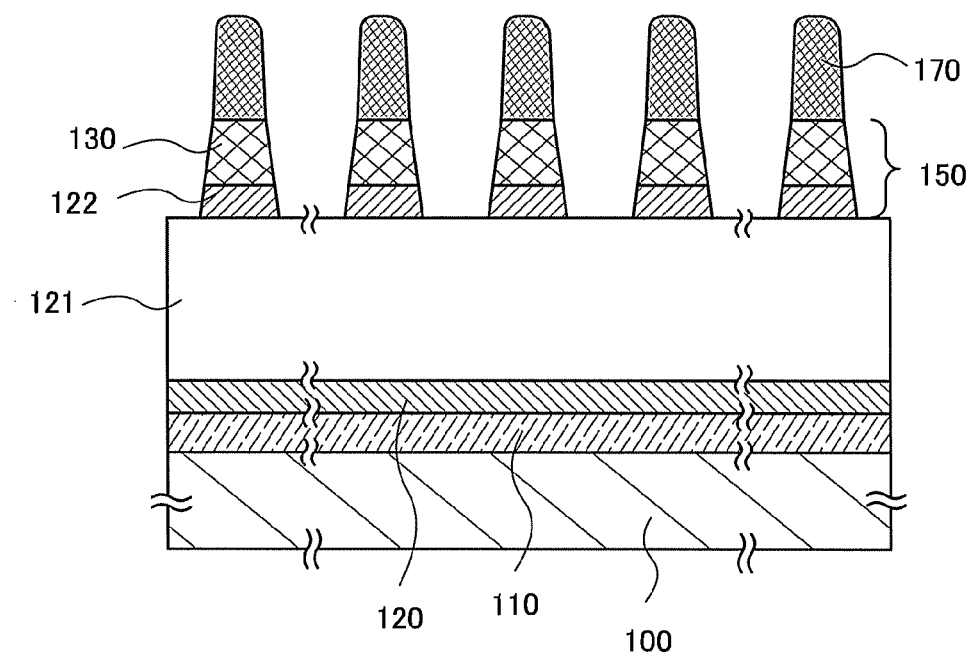

At the etching, the layers included in the stack 150 may be etched by consecutive steps. Further, although the stack may be etched by anisotropic etching in a manner such that the side surface of each layer may be substantially perpendicular to a surface of the layer, it is preferable that oxygen be added to an etching gas and etching be performed while the photoresist is made to recede. Alternatively, a step of making the photoresist recede by oxygen ashing and a step of etching the stack 150 may alternately be performed (see FIG. 4B).

Here, the term "consecutive steps" means a series of steps from the first step through the following required steps which are performed in the same chamber.

In addition, the following case is also within the scope of the consecutive steps in this specification: the case where the series of steps from the first step to the following required steps are performed in different chambers, but the substrate is transferred between the chambers without being exposed to air after the first step and then subjected to the following steps.

Note that between the first step and the following required steps, a substrate transfer step, an alignment step, a slowcooling step, a step of heating or cooling the substrate to a temperature which is necessary for the following required steps, or the like may be provided. Such a case is also within the scope of the consecutive steps in this specification.

Note that if a step in which liquid is used, such as a cleaning step, wet etching, or photoresist formation, is provided between the first step and the following required steps, the case is not within the scope of the consecutive steps in this specification.

Then, a silicon oxide film is formed as a light-transmitting insulating film which is to be the protective layer 180 by a plasma CVD method on a light-receiving plane side. In this embodiment, the thickness of the silicon oxide film is 100 nm. Then, elements are isolated by laser scribing. In this embodiment, a YAG laser with a wavelength of 1.06 μm and a beam diameter φ of 60 μm is used, and the laser beam is scanned with a repetition rate of 1 kHz and the rate at which beams overlap with each other, whereby liner dividing regions are formed so that a plurality of isolated cells are formed. Further, a contact hole which serves as a connection port of the first electrode can be formed in a similar manner with a laser.

Then, a photoresist for formation of the contact hole is formed over the protective layer 180 and wet etching for providing a connection port of the second electrode is performed. An etchant for the wet etching may be a hydrofluoric acid-based mixed solution containing ammonium hydrogen fluoride and ammonium fluoride. Obviously, dry etching can alternatively be performed. As an etching gas, a chlorine-based gas such as $Cl_2$, $BCl_3$, $SiCl_4$, or $CCl_4$, a fluorine-based gas such as $CF_4$, $SF_6$, or $NF_3$ can be used.

Note that a transparent insulating resin may be used as an alternative to the protective layer 180. By a screen printing method, a transparent insulating resin having contact holes can easily be formed.

Lastly, extraction electrodes are provided, whereby the photoelectric conversion device whose cross-sectional view is in FIG. 5A and plan view is in FIG. 5B is completed. For the extraction electrodes 190*a* and 190*b*, a metal film or a conductive resin film can be used. The metal film can be formed by a sputtering method or the like. The conductive resin film can be formed by a screen printing method or the like. Although the first electrode is connected to the extraction electrode 190*a* through the contact hole here, the photoelectric conversion cell may be partly etched so as to expose the first electrode. In addition, in the exposed region, an extraction electrode may be formed of a conductive resin. The conductive resin, for example, may be a silver paste or a nickel paste.

According to one embodiment of the present invention, the photoelectric conversion device has a portion where light can enter the intrinsic semiconductor layer 121 without passing through the stack 150. Accordingly, in that portion, the stack 150 may be removed (see FIG. 4B). Note that it is preferable that a part of the intrinsic semiconductor layer 121 be also etched. This is because by etching a part of the intrinsic semiconductor layer, a light-receiving area can be increased.

It is preferable that oxygen be added to an etching gas and etching be performed while the photoresist is made to recede. Alternatively, a step of making the photoresist recede by oxygen ashing and a step of etching the stack 150 may alternately be performed. These steps make the stack 150 tapered so that light can easily enter the intrinsic semiconductor layer 121 (see FIG. 4B).

By the example of the manufacturing method of the photoelectric conversion device described in this embodiment, openings can be formed in the stack 150, the stack 150 can be tapered, and the surface area of the intrinsic semiconductor layer 121 can be increased. Accordingly, the amount of light which reaches the intrinsic semiconductor layer 121 can be increased, leading to an improvement in conversion efficiency per unit area.

Note that this embodiment can be combined as appropriate with any of the other embodiments.

(Embodiment 3)

In this embodiment, an integration method for a photoelectric conversion device according to one embodiment of the present invention is described in detail with reference to drawings. Note that a description of the same parts as those of the above embodiment is omitted or partly simplified.

Figure 6A:
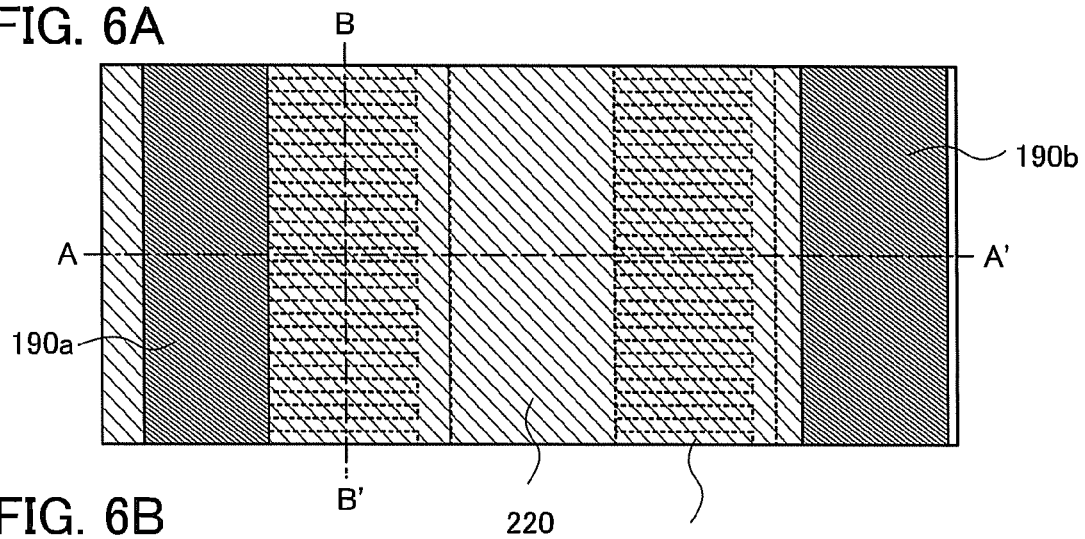
FIGS. 6A to 6C are a plan view and cross-sectional views illustrating a photoelectric conversion device according to one embodiment of the present invention.
Figure 6B:
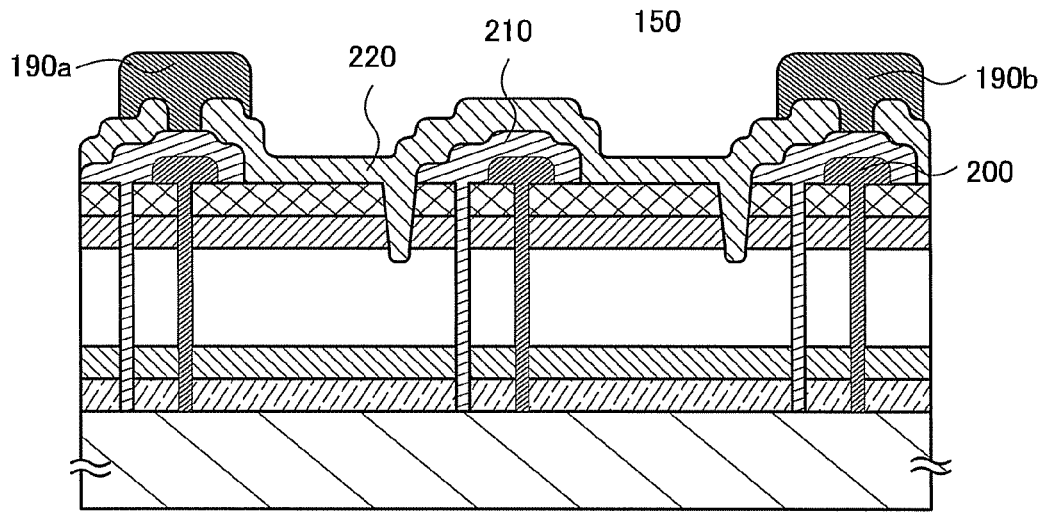
Figure 6C:
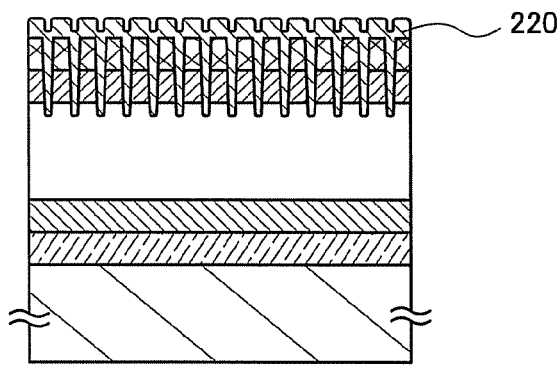

FIG. 6A is a plan view of the integrated photoelectric conversion device of this embodiment. FIGS. 6B and 6C are cross-sectional views taken along lines A-A' and B-B' in FIG. 6A, respectively. Although an example where two isolated cells are series connected for integration is shown in this embodiment, more cells can be integrated in order to obtain desired voltage.

In a usual nip thin film photoelectric conversion device, if steps up to the formation of the second electrode 130 are consecutively performed, integration would be difficult in terms of the structure. Therefore, a conductive film is formed after an element isolation step. In such a case where the film-forming steps are not consecutive, cleanness of an interface is poor and contamination may affect electrical characteristics; thus, an additional cleaning step is sometimes required.

On the other hand, in the photoelectric conversion device of this embodiment, an opening of the stack 150 including the second impurity semiconductor layer 122 and the second electrode 130 is provided near the end of each cell. A part of the opening has a function of isolating the cells; therefore, film formation of the first electrode 110 through the second electrode 130 can be performed consecutively.

Figure 7A:
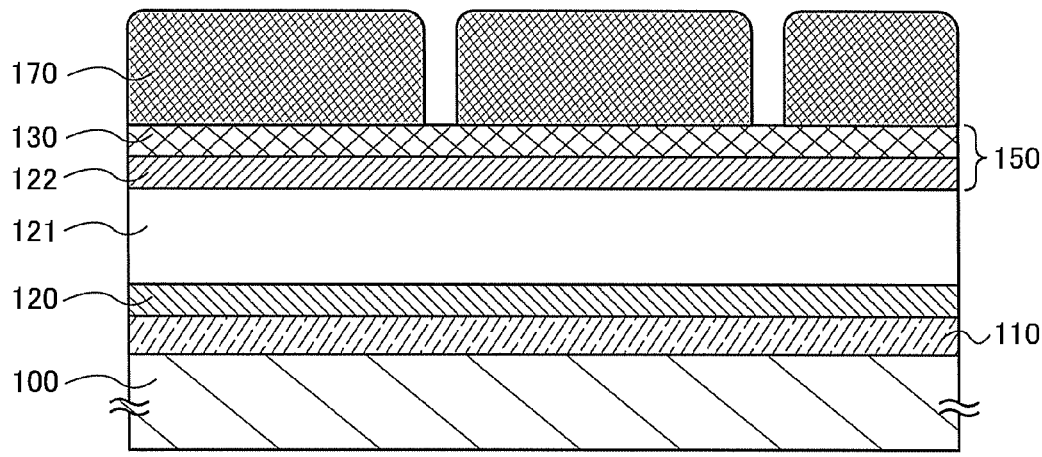
FIGS. 7A to 7C are cross-sectional views and a plan view illustrating a method for manufacturing a photoelectric conversion device according to one embodiment of the present invention.

A method for manufacturing the integrated photoelectric conversion device illustrated in FIGS. 6A to 6C is illustrated in FIGS. 7A to 7C and 8A to 8C. First, as is shown in FIG. 7A, a conductive film which is to be the first electrode 110, an n-type semiconductor layer which is to be the first impurity semiconductor layer 120, the intrinsic semiconductor layer 121, a p-type semiconductor layer which is to be the second impurity semiconductor layer 122, and a light-transmitting conductive film which is to be the second electrode 130 are formed in this order over the insulator 100. Specific materials which can be used here are those given in Embodiment 1 or 2.

The photoresist 170 having openings is formed over the second electrode 130. As is described in Embodiment 1, the opening has a suitable shape to have a preferable size. Note that, if the intrinsic semiconductor layer 121 is exposed in an element isolation portion or in a region where an electrode connecting the neighboring cells are formed, a conductive resin 210 and the intrinsic semiconductor layer 121 come into contact with each other, which may cause shortening or a reliability problem. Therefore, in this embodiment, a comb-like shape opening as the plane view of FIG. 7C is formed so as not to etch the stack 150 in the vicinity of the element isolation portion for integration.

In a usual integration method of a pin or nip thin film photoelectric conversion device, a scribe line which separates cells is filled with a conductive resin or the like so that a lower electrode of one cell and an upper electrode of the next cell can be connected. Thus, the upper and lower electrodes of the cell are shortened apparently. In practice, due to high electric resistance of the p-type semiconductor layer and the n-type semiconductor layer, they are not completely shortened. Still, the parallel resistance between the upper and lower electrodes of the cell is reduced, which may deteriorate characteristics or yield.

Figure 7B:
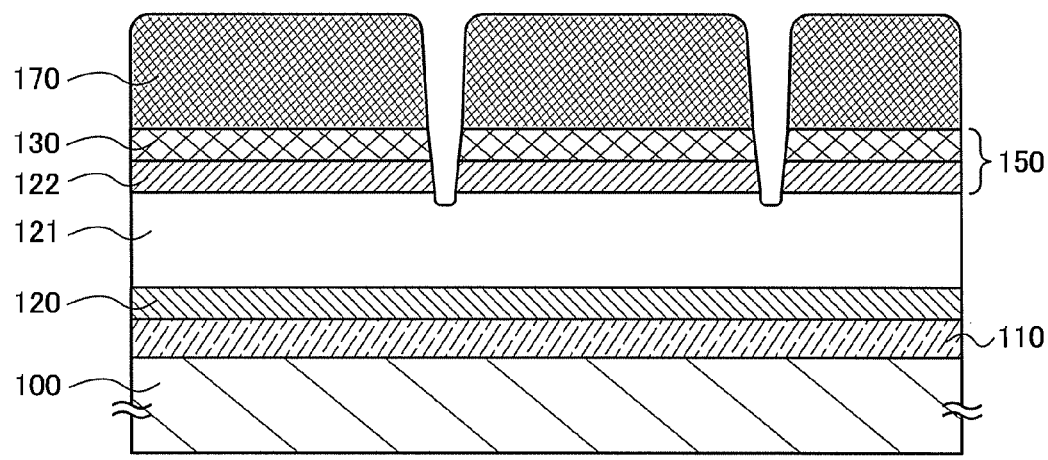
Figure 7C:
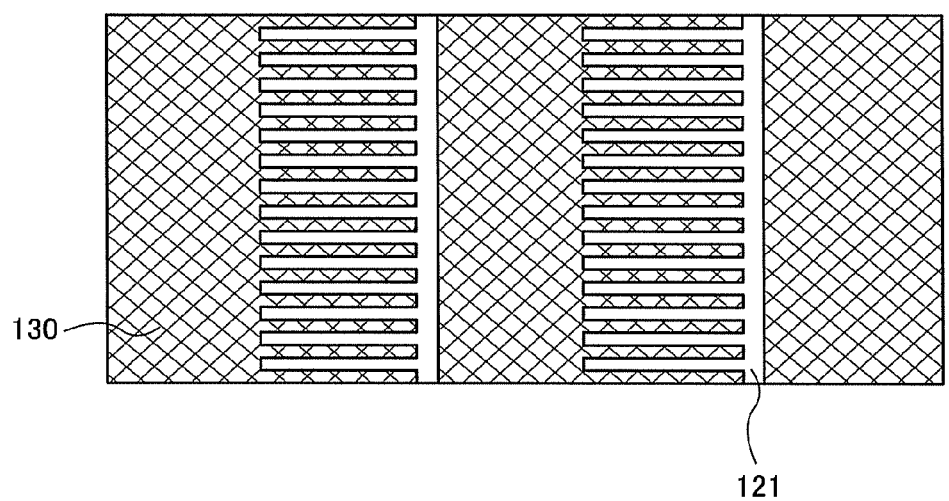

In this embodiment, as illustrated in FIGS. 7B and 7C, a groove which divides the stack 150 is formed near the end of the cell in an etching step, the parallel resistance between the upper and lower electrodes can be prevented from being reduced.

The etching step for forming the shape as in FIG. 7B can be performed by the method described in Embodiment 1. Here, dry etching is employed and a part of the intrinsic semiconductor layer 121 is also etched. Further, oxygen is added to an etching gas and a photoresist is made to recede during the etching, whereby the stack 150 is tapered.

Figure 8A:
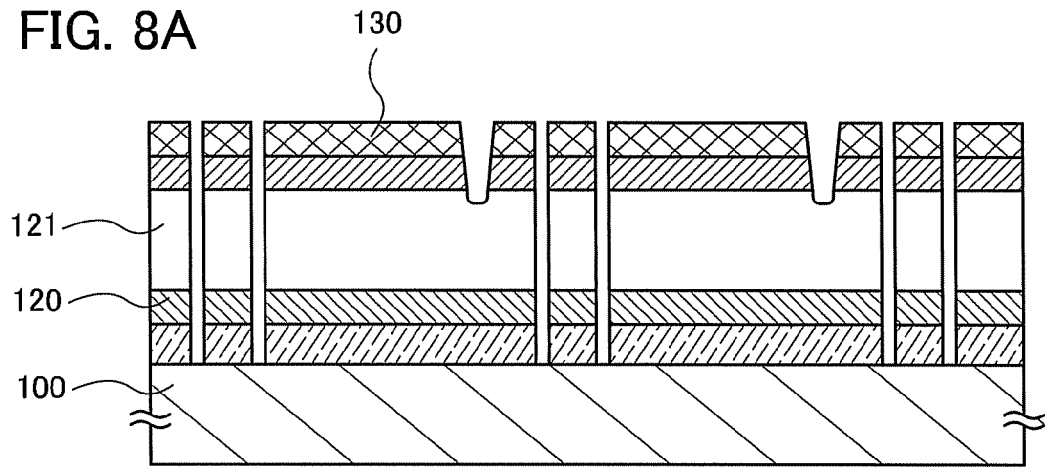
FIGS. 8A to 8C are cross-sectional views illustrating a method for manufacturing a photoelectric conversion device according to one embodiment of the present invention.

Then, as in FIG. 8A, scribes line for element isolation and scribe lines to be filled with a conductive material for series connection of the neighboring cells are formed close to each other.

The scribe line can be formed by a laser or the like as in Embodiment 2. The scribe line and its vicinity is a region which is shaded by an electrode or the like. The scribe lines are formed to be in an area as small as possible so as not to reduce the light-receiving portion which contributes to photoelectric conversion. Here, a scribe line for isolating elements is not necessarily provided and the scribe line to be filled with a conductive material alone can isolate the elements.

Figure 8B:
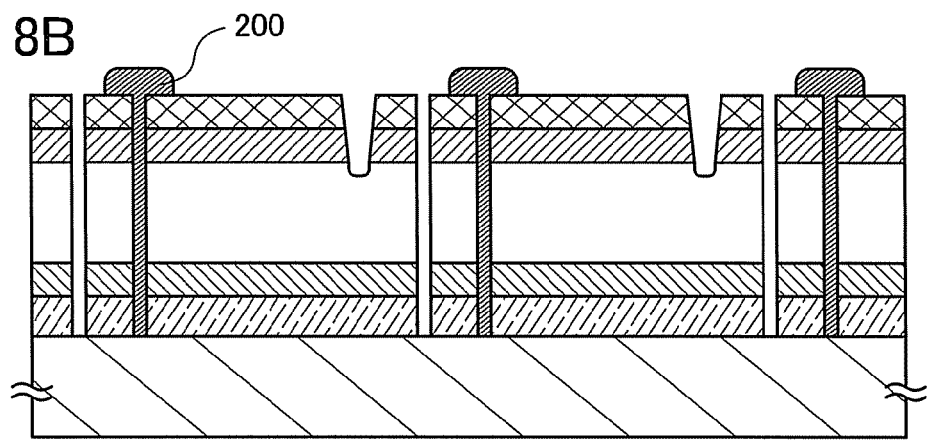
Figure 8C:
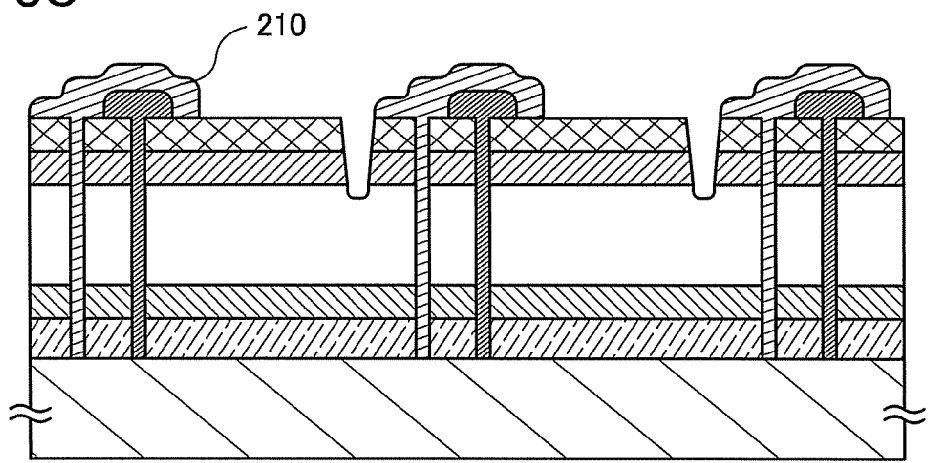

FIG. 8B illustrates a state where the scribe lines for element isolation are filled with an insulating resin 200. FIG. 8C illustrates a state where the scribe lines to be filled with a conductive material for series connection of the neighboring cells are filled with the conductive resin 210. Both of the scribe lines can be filled with a resin by screen printing or the like.

Then, a transparent insulating resin to be a protective film 220 and a conductive resin to be the extraction electrodes 190a and 190b are formed by a screen printing method. Thus, the structure in FIG. 6B is completed.

Figure 9A:
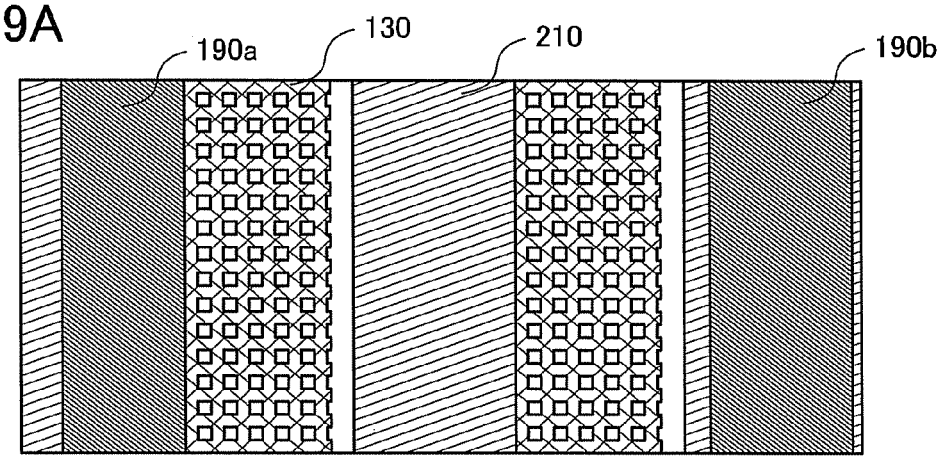
FIGS. 9A to 9C are plan views each illustrating a photoelectric conversion device according to one embodiment of the present invention.
Figure 9B:
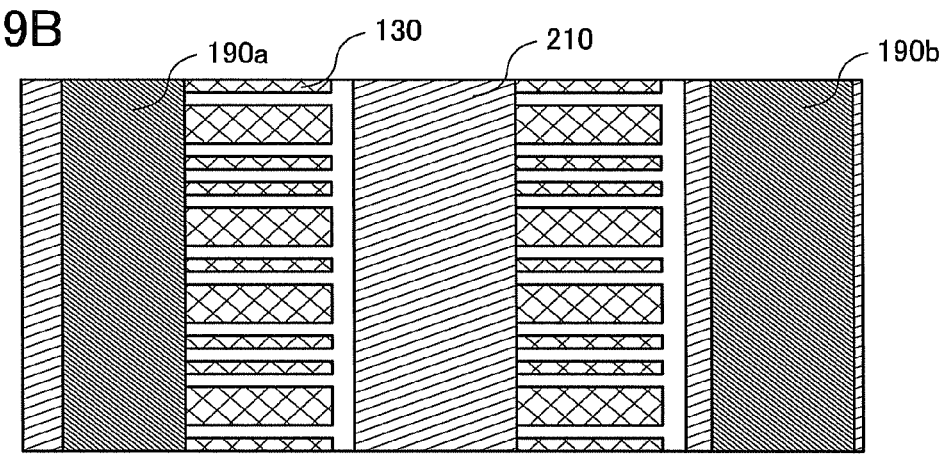
Figure 9C:
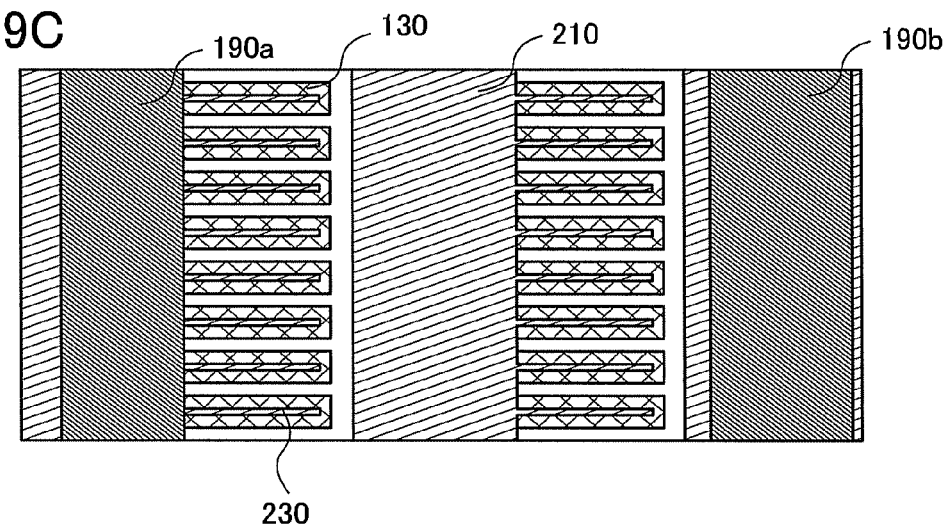

Although the opening has a comb-like shape in this embodiment, the shape of the opening in the stack 150 is not limited thereto; for example, the shape may be a square as in the case of FIG. 9A or a comb-like shape with unevenly spaced teeth as in the case of FIG. 9B. Note that the opening should have a suitable size described in Embodiment 1. Alternatively, the stack 150 may be wide enough to be provided with a collection electrode 230 as in the case of FIG. 9C. Note that in FIGS. 9A to 9C, the protective layer is not illustrated for the sake of clarity of the drawings.

Note that this embodiment can be combined as appropriate with any of the other embodiments.

This application is based on Japanese Patent Application serial no. 2009-158529 filed with Japan Patent Office on Jul. 3, 2009, the entire contents of which are hereby incorporated by reference.

The invention claimed is:

1. A photoelectric conversion device comprising a first cell and a second cell, each of the first cell and the second cell comprising:
a first conductive film to serve as a first electrode over an insulator;
a first impurity semiconductor layer having one conductivity type over the first electrode;
an intrinsic semiconductor layer over the first impurity semiconductor layer;
a second impurity semiconductor layer having an opposite conductivity type to the one conductivity type over the intrinsic semiconductor layer; and
a second conductive film, which is light-transmissive, to serve as a second electrode over the second impurity semiconductor layer,
wherein openings are formed in the second electrode and the second impurity semiconductor layer and at least one of the openings is formed in a light-receiving portion,
wherein the one of the openings is surrounded by the second impurity semiconductor layer and the second conductive film,
wherein a lowermost part of the one of the openings is inside of the intrinsic semiconductor layer,
wherein the first cell and the second cell are isolated from each other by a first scribe line filled with a resin,
wherein the first cell is electrically connected to the second cell through a second scribe line filled with a conductive resin, and
wherein each of the first scribe line and the second scribe line penetrates the first conductive film, the first impurity semiconductor layer, the intrinsic semiconductor layer, the second impurity semiconductor layer, and the second conductive film.

2. The photoelectric conversion device according to claim 1, wherein the conductivity type of the first impurity semiconductor layer is n-type and the conductivity type of the second impurity semiconductor layer is p-type.

3. The photoelectric conversion device according to claim 1, wherein a thickness of the intrinsic semiconductor layer under the openings is smaller than a thickness of the intrinsic semiconductor layer under the second electrode and the second impurity semiconductor layer.

4. The photoelectric conversion device according to claim 1, wherein the intrinsic semiconductor layer is an amorphous silicon, and
wherein a shortest distance between one portion of a wall of one of the openings and an opposite portion of the wall of the same opening at a level of an interface between the second impurity semiconductor layer and the intrinsic semiconductor layer is 0.5 μm to 3.0 μm inclusive.

5. The photoelectric conversion device according to claim 1, wherein the openings each have a shape selected from a polygon, a circle, and an ellipse.

6. The photoelectric conversion device according to claim 1, wherein the openings are tapered.

7. The photoelectric conversion device according to claim 1, wherein the second impurity semiconductor layer includes a-$Si_xC_{1-x}$: H (0<x<1) or a-$Si_xN_{1-x}$: H (0x<1).

8. A photoelectric conversion device comprising a first cell and a second cell, each of the first cell and the second cell comprising:
a first electrode over an insulator;
a first semiconductor layer containing an impurity and having one conductivity type over the first electrode;
a second semiconductor layer over the first semiconductor layer;
a third semiconductor layer containing an impurity and having an opposite conductivity type to the one conductivity type over the second semiconductor layer; and
a second electrode over the third semiconductor layer, the second electrode comprising a light-transmitting conductive film, wherein openings are formed in the second electrode and the third semiconductor layer and at least one of the openings is formed in a light-receiving portion, wherein the one of the openings is surrounded by the third semiconductor layer and the second electrode, wherein a lowermost part of the one of the openings is inside of the second semiconductor layer, wherein the first cell and the second cell are isolated from each other by a first scribe line filled with a resin, and wherein the first cell is electrically connected to the second cell through a second scribe line filled with a conductive resin, and wherein each of the first scribe line and the second scribe line penetrates the first electrode, the first semiconductor layer, the second semiconductor layer, the third semiconductor layer, and the second electrode.

9. The photoelectric conversion device according to claim 8, wherein the conductivity type of the first semiconductor layer is n-type and the conductivity type of the third semiconductor layer is p-type.

10. The photoelectric conversion device according to claim 8, wherein a thickness of the second semiconductor layer under the openings is smaller than a thickness of the second semiconductor layer under the second electrode and the third semiconductor layer.

11. The photoelectric conversion device according to claim 8, wherein a shortest distance between one portion of a wall of one of the openings and an opposite portion of the wall of the same opening at a level of an interface between the third semiconductor layer and the second semiconductor layer is 0.5 µm to 3.0 µm inclusive.

12. The photoelectric conversion device according to claim 8, wherein the openings each have a shape selected from a polygon, a circle, and an ellipse.

13. The photoelectric conversion device according to claim 8, wherein the openings are tapered.

14. The photoelectric conversion device according to claim 8, wherein the third semiconductor layer includes a-$Si_xC_{1-x}$: H ($0<x<1$) or a-$Si_xN_{1-x}$: H ($0<x<1$).

15. The photoelectric conversion device according to claim 1, wherein the intrinsic semiconductor layer is exposed in the openings.

16. The photoelectric conversion device according to claim 8, wherein the second semiconductor layer is exposed in the openings.

17. The photoelectric conversion device according to claim 1, wherein the first conductive film is reflective.

18. The photoelectric conversion device according to claim 8, wherein the first electrode is reflective.

19. The photoelectric conversion device according to claim 1, wherein the openings are filled with a transparent insulating resin.

20. The photoelectric conversion device according to claim 8, wherein the openings are filled with a transparent insulating resin.

21. The photoelectric conversion device according to claim 8, wherein the second semiconductor layer includes a microcrystal semiconductor or a polycrystalline semiconductor.

* * * * *

UNITED STATES PATENT AND TRADEMARK OFFICE
CERTIFICATE OF CORRECTION

PATENT NO. : 9,496,428 B2
APPLICATION NO. : 12/820439
DATED : November 15, 2016
INVENTOR(S) : Kazuo Nishi and Naoto Kusumoto It is certified that error appears in the above-identified patent and that said Letters Patent is hereby corrected as shown below:

In the Specification

Column 8, Line 10; Change "single junction" to --single-junction--.

Column 8, Line 12; Change "multi junction" to --multi-junction--.

In the Claims

Column 14, Line 53, Claim 7; Change "(0x<1)." to --(0<x<1).--.

Column 15, Line 9, Claim 8; Change "resin, and" to --resin,--.

Signed and Sealed this
Sixteenth Day of May, 2017

Michelle K. Lee
*Director of the United States Patent and Trademark Office*